(12) United States Patent
Schneider et al.

(10) Patent No.: US 8,941,650 B2
(45) Date of Patent: Jan. 27, 2015

(54) METHOD FOR VALIDATING FEATURES IN A DIRECT MODELING PARADIGM

(75) Inventors: Kevin Schneider, Portland, OR (US); Rahul Vora, Portland, OR (US); Jeffrey Thomas Strater, Portland, OR (US); Shu-Chieh Yeh, Lake Oswego, OR (US)

(73) Assignee: Autodesk, Inc., San Rafael, CA (US)

( * ) Notice: Subject to any disclaimer, the term of this patent is extended or adjusted under 35 U.S.C. 154(b) by 1221 days.

(21) Appl. No.: 12/510,855

(22) Filed: Jul. 28, 2009

(65) Prior Publication Data
US 2011/0025688 A1 Feb. 3, 2011

(51) Int. Cl.
*G06T 17/00* (2006.01)
*G06T 19/20* (2011.01)

(52) U.S. Cl.
CPC ................................. *G06T 19/20* (2013.01)
USPC .......................................... 345/420; 345/419

(58) Field of Classification Search
None
See application file for complete search history.

(56) References Cited

U.S. PATENT DOCUMENTS

| | | | |
|---|---|---|---|
| 6,629,065 B1 * | 9/2003 | Gadh et al. .......................... 703/1 |
| 6,888,542 B1 * | 5/2005 | Clauss .......................... 345/420 |
| 7,937,251 B2 * | 5/2011 | Turner et al. ...................... 703/2 |
| 8,032,337 B2 * | 10/2011 | Deichmann et al. .............. 703/1 |
| 8,207,990 B1 * | 6/2012 | DeSimone et al. ........... 345/630 |
| 2003/0208295 A1 * | 11/2003 | Ishii et al. ........................ 700/97 |
| 2007/0168923 A1 * | 7/2007 | Connor et al. ................. 717/104 |
| 2007/0225847 A1 * | 9/2007 | Pietsch et al. ................... 700/98 |
| 2010/0013833 A1 * | 1/2010 | Gandikota et al. ............. 345/420 |

* cited by examiner

*Primary Examiner* — Daniel Hajnik
(74) *Attorney, Agent, or Firm* — Patterson & Sheridan, LLP

(57) ABSTRACT

A CAD system enables a designer to freely modify a model of a design without regenerating a history of the model, as in traditional parametric feature based modeling. The CAD system automatically determines whether the modifications to the model invalidate current features associated with the model and whether the modifications create new features that should be added to the model. Such a CAD system enables a designer to quickly edit designs and simultaneously preserve design intent without requiring the significant computational resources of historical based approaches that regenerate a geometry upon every edit made by a designer.

18 Claims, 4 Drawing Sheets

METHOD FOR VALIDATING FEATURES IN A DIRECT MODELING PARADIGM

BACKGROUND OF THE INVENTION

1. Field of the Invention

The present invention generally relates to computer aided design ("CAD") and, more specifically, to identifying features in CAD models.

2. Description of the Related Art

Current CAD systems typically utilize parametric feature based modeling to create computer-based models for designs. In parametric feature based modeling, a model for a design can be generally thought of as a collection of features.

A feature is a data object representing a form or a shape (such as a hole, slot, extrusion, boss, pocket, etc.) that may be incorporated into a particular model. The data object describes the mechanical properties of the feature by including shape information that generally defines the geometric requirements for the feature (e.g., how many planar faces, cylindrical faces, etc.), position information (e.g., what positional constraints are imposed on the geometric faces of the feature in relation to one another, etc.), and parametric information that can be modified to change the characteristics of a particular instance of a feature in a model (e.g., the depth of a hole, the diameter of a slot, etc.).

A model that is created in a CAD system utilizing parametric feature based modeling is stored as a history of the various operations that were performed by a designer to generate the model. In order to edit the model, a designer selects an existing feature in the model to either delete, replace or change its parameters. In response to the designer's edit, the CAD system locates the original operation relating to the selected feature in the history of the model and changes the operation accordingly (e.g., delete, replace, parameter change, etc.). The CAD system then automatically re-executes all the subsequent operations in the history in order to regenerate and display the model's geometry (i.e., the resultant 2D or 3D on-screen graphical representation of the model). The use of features and the historical based nature of parametric feature based modeling enable designers to modify models without compromising the integrity of the original design intent (i.e., maintaining the mechanical integrity of the original design by respecting the constraints of the current features in the model, etc.). For example, a complex design for an engine can be stripped down to a core engine block by removing the effects of operations in the history of the original model until only the core engine block remains. The core engine block can then be modified (e.g., shape or dimensional changes, etc.) to create a configuration of the engine that is slightly different than the original design. Upon completion of the modification, all the subsequent feature additions (e.g., addition of holes, extrusions, etc.) that were stored as operations in the history of the design are re-executed onto the modified engine block such that the mechanical soundness of the design intent in the original engine design is maintained. As such, parametric feature based modeling provides the capability to more easily create multiple configurations of a design that preserve the design intent of an original design. However, providing such capability also results in added complexity from a designer perspective. For example, a designer needs to properly understand the history of a design in order to find the appropriate operation in the history to edit the design as desired. A lack of such understanding of the history can lead to "brittle" designs that fail during regeneration of the model because edits made by a designer in the history cannot be reconciled with subsequent operations in the history. Additionally, parametric feature based modeling also requires significant computational resources due to the need to store history and regenerate geometries based on the re-execution of historical operations. As such, editing models using parametric feature based modeling can often be time-consuming.

In contrast to parametric feature based modeling, direct or explicit modeling does not maintain a history of operations and does not utilize the concept of features. Instead, a model created through direct modeling primarily consists of the geometry of the model itself. Edits made by designers are simply made directly in the geometry, without considering whether such edits may violate the mechanical integrity of an original design intent. As such, designers can very quickly and freely edit the geometry of a model without consuming significant time and computational resources to regenerate the geometry using a history of operations. However, the shape and forms in the geometry of a model created with explicit modeling are not associated with data objects (i.e., such as features) that describe the mechanical constraints and requirements of the shape or feature. As such, when a designer makes a modification to the geometry of a model, the design intent of the original model can be easily destroyed and the mechanical soundness of the model be compromised as a result of the modification.

SUMMARY OF THE INVENTION

One or more embodiments of the present invention provide a CAD system that enables a designer to quickly and freely make modifications to the geometry of a model without consuming significant computational resources, similar to traditional explicit modeling, but that also preserves the design intent of the original design by associating features with the shapes in the geometry, similar to traditional parametric feature-based modeling. In particular, a model generated by a CAD system according to one or more embodiments of the present invention comprises a plurality of data objects wherein each data object represents a design feature. Furthermore, each data object is defined by a plurality of geometric faces and is associated with set of rules relating to the position of the geometric faces in relation to one another.

A computer-implemented method for modifying a model generated by a CAD system includes the steps of executing an edit operation to edit a graphical representation of the model, identifying a first data object that includes a geometric face modified by the edit operation, determining whether the plurality of geometric faces defining the first data object conforms to the set of rules associated with the first data object, and updating the plurality of data objects based on whether the plurality of geometric faces defining the first data object conforms to the set of rules associated with the first data object. For example, in one embodiment, if the determining step determines that the plurality of geometric faces defining the first data object conforms to the set of rules associated with the first data object, then the updating step changes a parameter maintained by the first data object to reflect the modification of the first data object by the edit operation. If, instead, the determining step determines that the plurality of geometric faces defining the data object does not conform to the set of rules associated with the data object, then the updating step removes the first data object from the plurality of data objects comprising the model and attempts to identify a new design feature formed by the modified geometric face, create a second data object that corresponds to the new design feature formed by the modified geometric face, and then add the second data object to the plurality of data objects comprising the model.

One advantage of the disclosed method is that a designer is able to maintain a level of editing freedom that is similar to traditional direct modeling approaches, but still preserve design intent through the use of features in a manner similar to parametric feature-based modeling approached.

DETAILED DESCRIPTION

Figure 1:
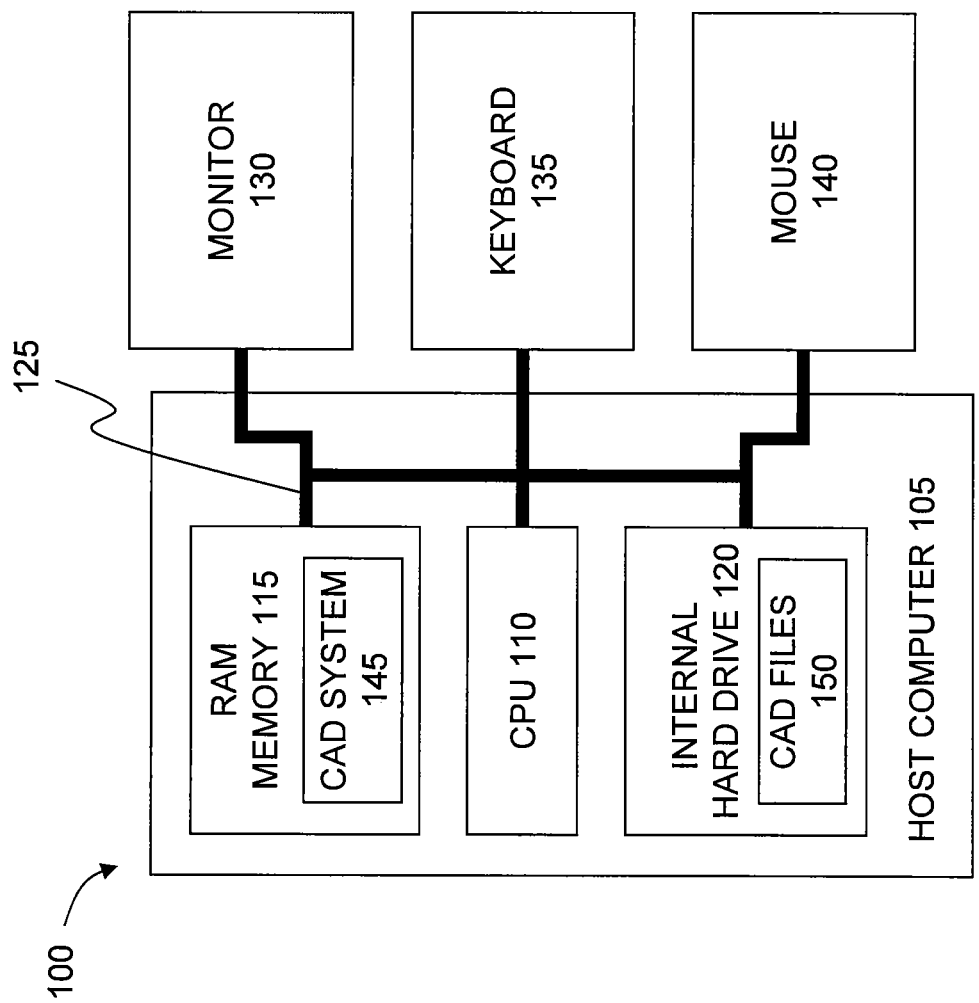
FIG. 1 illustrates a computer system configured to implement one or more embodiments of the present invention.

FIG. 1 illustrates a computer system configured to implement one or more embodiments of the present invention. Computer system 100 is a general purpose computer such as, for example, a desktop computer, laptop computer or any other computer. Computer system 100 includes a host computer 105 with a central processing unit (CPU) 110, a random access memory (RAM) 115 and an internal hard disk drive 120. The CPU 110, RAM 115 and internal hard disk driver 120 interact through a system bus 125 that also enables the host computer 100 to interact a display device, such as monitor 130, and input devices, such as keyboard 135 and mouse 140. A CAD system 145 (i.e., written in software) is loaded into RAM 115 and stores CAD files 150 in internal hard driver 120. Such CAD files 150, for example, store CAD models designed by a designer through the use of CAD system 145. It should be recognized that FIG. 1 and the foregoing description are simplified representations of a real general purposes computer and that there are many additional and alternative software and hardware components and peripheral devices that may be included in a general purpose computer in which a CAD system according to one or more embodiments of the present invention may be run.

Figure 2:
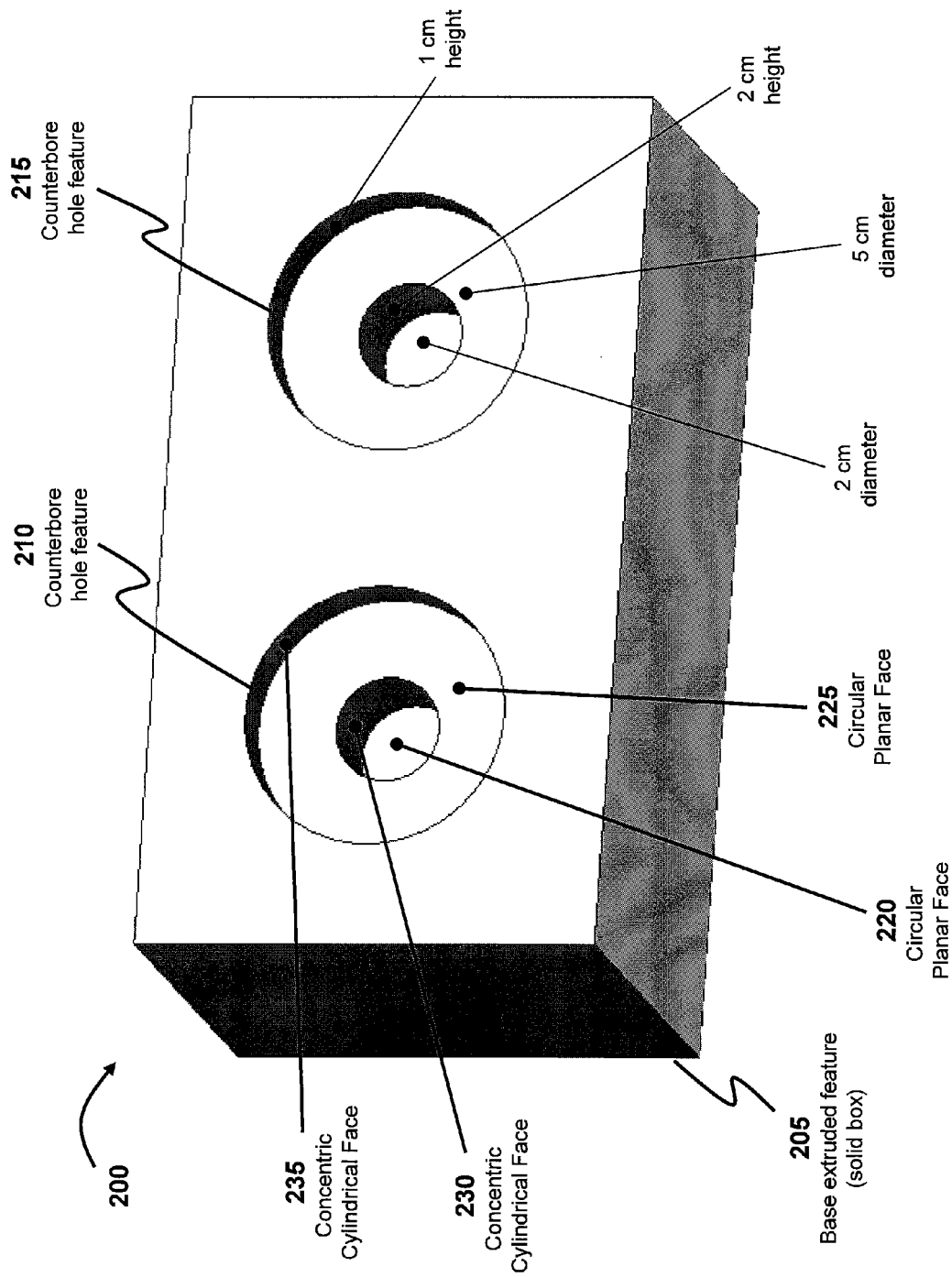
FIG. 2 illustrates a geometry of a model using a CAD system, according to one embodiment of the present invention.

FIG. 2 illustrates a geometry of a model using a CAD system, according to one embodiment of the present invention. A geometry, as depicted in FIG. 2, is a graphical representation of an underlying model 200 for a particular design. A model created by a CAD system according to one or more embodiments of the present invention is comprised of a collection of features. Each feature in a model can be considered a data object comprising a collection of geometric faces, rules describing how the collection of faces should be positioned in relation to one another, and parameters the describe the dimensions of a particular instance of a feature. Features include, for example, basic "building block" features that enable a designer to create solid objects of various shapes and forms. Such basic features include an extruded feature, revolved feature, loft feature and sweep feature. A solid block, for example, can be created as an extruded feature by sketching a rectangle of a specified height and width and then requesting the CAD system to "extrude" the rectangle to a certain depth. Similarly, a solid sphere, for example, can be created as a revolved feature, by sketching a circle of a specified diameter and then requesting the CAD system to "revolve" the circle along its axis. Embodiments of CAD systems may further include pre-constructed features, such as a variety of holes, shells, threads, coils, etc. Furthermore, as used herein, the term "feature" may refer to either the geometric feature displayed in a geometry or the underlying data object represented by the displayed geometric feature, as the context suggests.

For example, model 200 comprises a base extruded feature, namely a solid box 205, and two identical counterbore hole features, 210 and 215, that have been cut into solid box 205. A counterbore hole feature is defined in the embodiment of FIG. 2 as having two parallel circular planar faces, 220 and 225 and two concentric cylindrical faces, 230 and 235, with surface normal vectors pointed towards the cylinder axis (i.e., resulting in cylinders that have removed solid material from solid box 205, representative of a hole). A counterbore hole feature further maintains parameter values for the diameters of the two parallel circular planar faces and for heights of the two concentric cylindrical faces. For example, as depicted in FIG. 2, each of counterbore holes features 210 and 215 has a first diameter of 2 centimeters, a second diameter of 5 centimeters, a first height of 2 centimeters, and a second height of 1 centimeter. It should be recognized that the foregoing description is a simplification of basic CAD functionality and that real-world CAD systems may have many types of features, with different properties, rules, parameters, definitions, and constraints.

Figure 3:
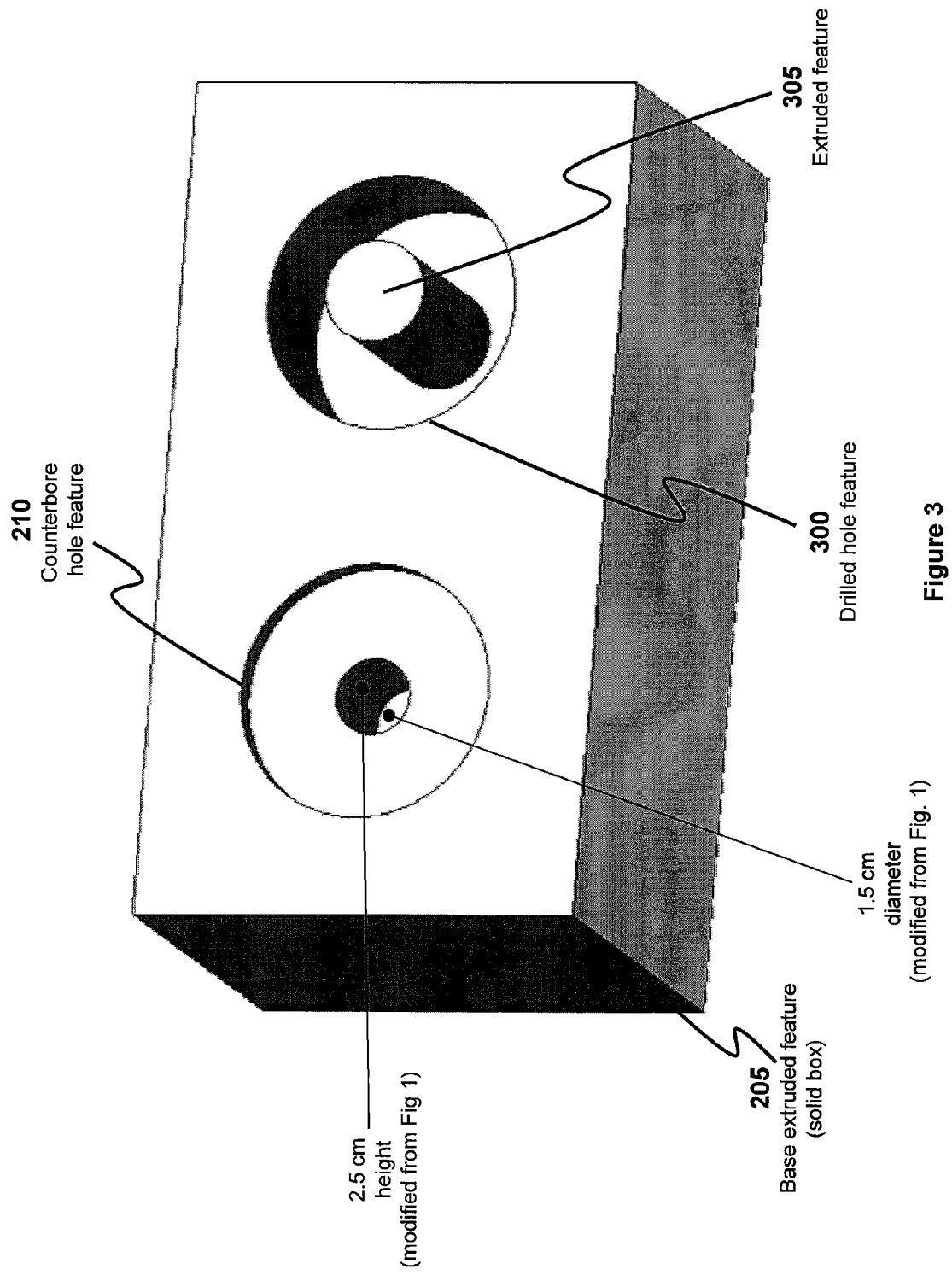
FIG. 3 illustrates the geometry of FIG. 1 after edits performed by a designer through the CAD system.

FIG. 3 illustrates the geometry of FIG. 2 after edits performed by a designer through the CAD system, according to one embodiment of the present invention. As depicted, the designer has modified both counterbore holes 210 and 215. With respect to counterbore hole feature 210, the designer has reduced the first diameter to a value of 1.5 centimeters and has increased the first height of to 2.5 centimeters. Despite the modifications, however, counterbore hole feature 210 still falls within the definition of a counterbore hole feature and the CAD system therefore simply changes the parameter values for counterbore hold feature 210. In contrast, counterbore hole feature 215 no longer exhibits the characteristics of a counterbore hole feature. In particular, with respect to counterbore hole feature 215, the designer has extended the bottom face of the inner cylinder up above the surface of solid box 205, thereby filling solid material into the middle of the hole. In essence, the modification of the designer has destroyed counterbore hole feature 215 and has generated a drilled hole feature 300 and an extruded feature 305. The drilled hole feature 300 has a diameter of 5 centimeters and a height of 3 centimeters. The extruded feature 305 also has a circular profile and has added a protruding solid cylinder into the center of drilled hole feature 300. Accordingly, upon completion of this modification, the CAD system removes counterbore hole feature 215 from the collection of features maintained by model 200 and adds drilled hole feature 300 and extruded feature 305 to the collection.

Figure 4:
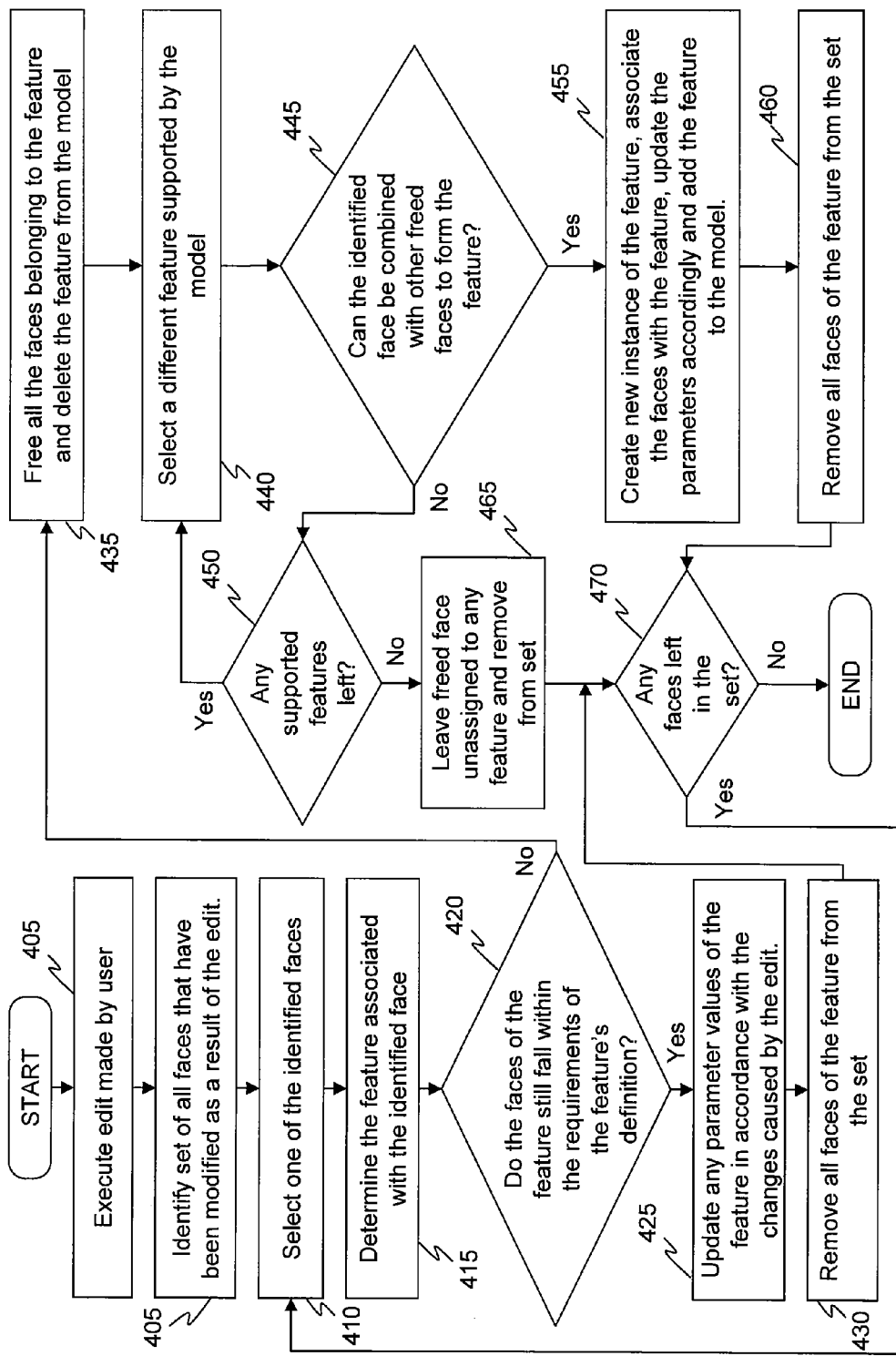
FIG. 4 is a flow chart of method steps for validating features of a model upon edits to made the model, according to one embodiment of the present invention.

FIG. 4 is a flow chart of method steps for validating features of a model upon edits to made the model, according to one embodiment of the present invention. Although the method steps are described in conjunction with CAD system 145 of the general purpose computer of FIG. 1, persons skilled in the art will understand that any CAD system configured to perform the method steps, in any computer system and in any order, falls within the scope of the present invention.

In step 400, CAD system 145 executes an edit made by the designer to an existing model. In one embodiment, such an edit, may be, for example, any type of modification that can be made to the geometry of a traditional explicit modeling-based CAD system, such as, without limitation, the stretching, shrinking or moving of existing lines and curves, the dimensional stretching and moving of forms and shapes such as blocks, cylinders, quadrangles, ellipses, circles, and the like, as well as the addition and removal of features supported by the CAD system. In such an embodiment, edits are not restricted or otherwise constrained by the definitions of features, as may be the case in a traditional parametric feature based modeling CAD system (i.e., an edit, as exemplified in FIG. 3 with respect to counterbore hole feature 215, that can destroy an existing feature of the model is permitted by the CAD system).

In step 405, CAD system 145 identifies a set all the faces in the model that have been modified (or otherwise affected) as a result of the edit. In step 410, CAD system 145 selects one of the identified faces and identifies the underlying feature stored by the model (i.e., as one of its collection of features) that is associated with the selected face in step 415.

Proceeding now to step 420, if, in this step, CAD system 145 determines that the various faces of the identified feature still fall within the requirements of the feature's definition (e.g., such as depicted in the edits of FIG. 3 to counterbore hole feature 210), then in step 425, CAD system 145 updates the parameter values of the feature in accordance with the changes caused by the edit. This step 425 is generally referred to as "feature validation." In step 430, CAD system 145 removes any of the faces of the feature that are in the set identified in step 405 (i.e., since they have been confirmed to be part of a validated feature).

If, however, in step 420, CAD system 145 determines that the various faces of the feature do not fall within the requirements of the feature's definition (e.g., such as depicted in the edits of FIG. 3 to counterbore hole feature 215), then in step 435, CAD system 145 deletes the feature from the model's collection of features, thereby freeing or otherwise disassociating the faces of the feature from any existing feature in the model. In steps 440 through 450, CAD system 145 begins iterating through its various other supported features and, in step 445, if the identified face can be combined with other freed faces to form one of the other supported features (e.g., such as extruded features 300 and 305 in FIG. 3), then in step 455, CAD system 145 create a new instance of such a feature, associates the identified face and any other required freed faces with the feature, updates the parameters of the feature accordingly and adds the feature to the model's collection of features. This step 455 is generally referred to as "feature re-recognition."

In step 460, CAD system 145 removes those faces that were added to the feature from the set identified in step 405. If, however, none of the features can support the identified face, then in step 465, CAD system 145 leaves the face unassociated with any features and removes it from the set identified in step 405. If there are any identified faces left in the set, as determined in step 470, CAD system 145 returns to step 410. Otherwise, CAD system 145 has completed updating the collection of features associated with the model.

In sum, a method for modifying a model generated by a CAD system is disclosed. The CAD system allows edits to be freely made by a designer in a manner similar to that of traditional direct modeling approaches. However, the CAD system also preserves design intent by using features similar to those of parametric feature-based modeling approached. Such a CAD system enables a designer to quickly edit designs and simultaneously preserve design intent without requiring the significant computational resources of historical based approaches that regenerate a geometry upon every edit made by a designer.

While the foregoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention. Therefore, the scope of the present invention is determined by the claims that follow.

We claim:

1. A computer-implemented method for modifying a model generated by a computer-aided design (CAD) system, the method comprising:

executing an edit operation to edit a graphical representation of the model, wherein the model comprises a plurality of data objects, wherein each data object represents a design feature, is defined by a plurality of geometric faces, and is associated with a different set of rules describing the positions of the geometric faces in relation to one another;

identifying a first data object that includes a geometric face modified by the edit operation;

determining that the plurality of geometric faces defining the first data object does not conform to the set of rules associated with the first data object;

in response to determining that the plurality of geometric faces does not conform to the set of rules, freeing all the geometric faces defining the first data object, wherein freeing all the geometric faces comprises disassociating all the geometric faces from the first data object;

determining, via a processor, that the modified geometric face can be combined with a free geometric face to form a new design feature;

creating a second data object that corresponds to the new design feature;

adding the second data object to the plurality of data objects comprising the model; and updating the plurality of data objects based on the second data object.

2. The method of claim 1, further comprising removing the first data object from the plurality of data objects comprising the model after determining that the plurality of geometric faces defining the first data object do not conform to the set of rules associated with the first data object.

3. The method of claim 2, further comprising selecting the new design feature from various design features supported by the system before determining that the modified geometric face can be combined with the free geometric face.

4. The method of claim 3, further comprising associating other free geometric faces with the second data object before adding the second data object.

5. The method of claim 4, further comprising identifying a set of geometric faces modified by the edit before identifying the first data object, and removing all free geometric faces associated with the second data object from the set of geometric faces.

6. The method of claim 1, wherein freeing all the geometric faces comprises deleting the design feature represented by the first data object from a collection of design features of the model.

7. A non-transitory computer-readable medium including instructions for a computer-aided design (CAD) system that, when executed by a processing unit of a computer system, causes the processing unit to modify a model generated by the CAD system by performing the steps of:

executing an edit operation to edit a graphical representation of the model, wherein the model comprises a plurality of data objects, wherein each data object represents a design feature, is defined by a plurality of geometric faces, and is associated with a different set of rules describing the positions of the geometric faces in relation to one another;

identifying a first data object that includes a geometric face modified by the edit operation;

determining that the plurality of geometric faces defining the first data object does not conform to the set of rules associated with the first data object;

in response to determining that the plurality of geometric faces does not conform to the set of rules, freeing all the geometric faces defining the first data object, wherein freeing all the geometric faces comprises disassociating all the geometric faces from the first data object;

determining that the modified geometric face can be combined with a free geometric face to form a new design feature;

creating a second data object that corresponds to the new design feature;

adding the second data object to the plurality of data objects comprising the model; and updating the plurality of data objects based on the second data object.

8. The computer-readable medium of claim 7, further comprising removing the first data object from the plurality of data objects comprising the model after determining that the plurality of geometric faces defining the first data object do not conform to the set of rules associated with the first data object.

9. The computer-readable medium of claim 8, further comprising selecting the new design feature from various design features supported by the system before determining that the modified geometric face can be combined with the free geometric face.

10. The computer-readable medium of claim 9, further comprising associating other free geometric faces with the second data object before adding the second data object.

11. The computer-readable medium of claim 10, further comprising identifying a set of geometric faces modified by the edit before identifying the first data object, and removing all free geometric faces associated with the second data object from the set of geometric faces.

12. The computer-readable medium of claim 7, wherein freeing all the geometric faces comprises deleting the design feature represented by the first data object from a collection of design features of the model.

13. A computer system configured to modify a model generated by a computer-aided design (CAD) system, the computer system comprising:

a display for displaying a graphical representation of the model, wherein the model comprises a plurality of data objects, wherein each data object represents a design feature, is defined by a plurality of geometric faces, and is associated with a different set of rules describing the positions of the geometric faces in relation to one another;

an input device for enabling a user to edit the graphical representation of the model; and a processing unit programmed to perform the steps of:

executing an edit operation corresponding to the user's edit, identifying a first data object including a geometric face that has been modified by the edit operation, determining that the plurality of geometric faces defining the first data object does not conform to the set of rules associated with the first data object, in response to determining that the plurality of geometric faces does not conform to the set of rules, freeing all the geometric faces defining the first data object, wherein freeing all the geometric faces comprises disassociating all the geometric faces from the first data object, determining that the modified geometric face can be combined with a free geometric face to form a new design feature, creating a second data object that corresponds to the new design feature, adding the second data object to the plurality of data objects comprising the model, and updating the plurality of data objects based on the second data object.

14. The system of claim 13, further comprising removing the first data object from the plurality of data objects comprising the model after determining that the plurality of geometric faces defining the first data object do not conform to the set of rules associated with the first data object.

15. The system of claim 14, further comprising selecting the new design feature from various design features supported by the system before determining that the modified geometric face can be combined with the free geometric face.

16. The system of claim 15, further comprising associating other free geometric faces with the second data object before adding the second data object.

17. The system of claim 16, further comprising identifying a set of geometric faces modified by the edit before identifying the first data object, and removing all free geometric faces associated with the second data object from the set of geometric faces.

18. The system of claim 13, wherein the step of freeing all the geometric faces comprises deleting the design feature represented by the first data object from a collection of design features of the model.

* * * * *